(12) United States Patent
Yasuda

(10) Patent No.: US 6,407,814 B1
(45) Date of Patent: Jun. 18, 2002

(54) METHOD FOR CORRECTING ALIGNMENT, METHOD FOR MANUFACTURING A SEMICONDUCTOR DEVICE AND A SEMICONDUCTOR DEVICE

(75) Inventor: Tsuneo Yasuda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/648,751

(22) Filed: Aug. 28, 2000

Related U.S. Application Data

(62) Division of application No. 09/048,163, filed on Mar. 26, 1998, now Pat. No. 6,177,330.

(30) Foreign Application Priority Data

Sep. 26, 1997 (JP) .............................................. 9-261580

(51) Int. Cl.[7] .............................................. G01B 11/00
(52) U.S. Cl. ...................................................... 356/401
(58) Field of Search ................................ 356/399, 400, 356/401; 250/548; 355/53, 55

(56) References Cited

U.S. PATENT DOCUMENTS

| | | | | |
|---|---|---|---|---|
| 5,243,195 A | * | 9/1993 | Nishi | 250/548 |
| 5,243,377 A | | 9/1993 | Umatate et al. | |
| 5,444,538 A | * | 8/1995 | Pellegrini | 356/401 |
| 5,557,855 A | * | 9/1996 | Hwang | 33/613 |
| 5,563,708 A | * | 10/1996 | Nakai | 356/363 |
| 5,696,835 A | * | 12/1997 | Hennessey et al. | 382/141 |
| 5,792,580 A | * | 8/1998 | Tomimatu | 430/22 |
| 5,844,247 A | * | 12/1998 | Nishi | 250/548 |
| 5,877,861 A | * | 3/1999 | Ausschnitt et al. | 356/401 |
| 5,959,721 A | * | 9/1999 | Nishi | 355/53 |
| 5,989,759 A | * | 11/1999 | Ando et al. | 430/22 |
| 6,118,515 A | * | 9/2000 | Wakamoto et al. | 355/53 |

FOREIGN PATENT DOCUMENTS

TW 305925 5/1997

* cited by examiner

Primary Examiner—F. L. Evans
Assistant Examiner—Zandra Smith
(74) Attorney, Agent, or Firm—Oblon, Spivak, McClelland, Maier & Neustadt, P.C.

(57) ABSTRACT

A manufacturing system for a semiconductor device manages a lower pattern (100) corresponding to a pattern (200) in the semiconductor device and the rotation of the lower pattern (100) from the position of a reference axis ±0 to the position of a central axis of the pattern (100). The manufacturing system generates a stepper correction value including the rotation of the lower pattern (100) to determine the position of the pattern (200) and gives the stepper correction value to a stepper. With the stepper correction value, it is possible to prevent any shear out of specification between the upper and lower patterns. Thus, a method for correcting alignment and a method for manufacturing a semiconductor device, by which any shear is prevented, can be provided.

6 Claims, 20 Drawing Sheets

FIG. 10

| LOT NO. | | XYZ-100 | XYZ-100 |
|---|---|---|---|
| TYPE OF WAFER | | A | A |
| MAJOR STEP | UPPER PATTERN | THE FIRST MAJOR STEP | THE SECOND MAJOR STEP |
| | LOWER PATTERN | NOTHING | THE FIRST MAJOR STEP |
| STEPPER CODE | UPPER PATTERN | STEP1 | STEP2 |
| | LOWER PATTERN | NOTHING | STEP1 |
| EXPOSURE DATE | | 10/03. 01:00 | 10/04. 01:00 |
| STEPPER CORRECTION VALUE | OFFSET (X) | 0.01 | 0.02 |
| | S | 0 | 0 |
| LOWER-PATTERN ROTATION | | 0 | 0 |
| OCCV | OFFSET (X) | 0.01 | 0.02 |
| | K | −1 | 0 |
| TRUE SHEAR | OFFSET (X) | 0.02 | 0 |
| | S−K | +1 | 0 |
| STEP-ROTATION | | −1 | −1 |
| SELF-ROTATION | | −1 | −1 |

| TYPE OF WAFER | A | A |
|---|---|---|
| MAJOR STEP (UPPER PATTERN) | THE FIRST MAJOR STEP | THE SECOND MAJOR STEP |
| MAJOR STEP (LOWER PATTERN) | NOTHING | THE FIRST MAJOR STEP |
| | | |

FIG. 17

| | | |
|---|---|---|
| LOT NO. | | XYZ-200 |
| TYPE OF WAFER | | ABC |
| MAJOR STEP | UPPER PATTERN | THE NINTH MAJOR STEP |
| | LOWER PATTERN | NOTHING |
| STEPPER CODE | UPPER PATTERN | STEP1 |
| | LOWER PATTERN | NOTHING |
| EXPOSURE DATE | | 10/03. 01:00 |
| STEPPER CORRECTION VALUE | OFFSET (X) | 0.01 |
| | S | -3.0 |
| LOWER-PATTERN ROTATION | | NOTHING |
| LOWER-PATTERN VARIATION | | 0 |
| OCCV | OFFSET (X) | -0.01 |
| | K | -6.5 |
| TRUE SHEAR | OFFSET (X) | 0.02 |
| | S-K | +3.5 |
| STEP-ROTATION | | NOTHING |
| SELF-ROTATION | | NOTHING |
| SELF-VARIATION | | 0 |

| TYPE OF WAFER | A | A | ABC |
|---|---|---|---|
| MAJOR STEP (UPPER PATTERN) | THE FIRST MAJOR STEP | THE SECOND MAJOR STEP | THE NINTH MAJOR STEP |
| MAJOR STEP (LOWER PATTERN) | NOTHING | THE FIRST MAJOR STEP | THE THIRD MAJOR STEP |
| INITIAL VALUE | 0 | 0 | -3.0 |
| | | | |

METHOD FOR CORRECTING ALIGNMENT, METHOD FOR MANUFACTURING A SEMICONDUCTOR DEVICE AND A SEMICONDUCTOR DEVICE

This application is a Division of application Ser. No. 09/048,163 Filed on Mar. 26, 1998 now U.S. Pat. No. 6,177,330.

BACKGROUND OF THE INVENTION

1. Field of the Invention

The present invention relates to a method for correcting alignment to make a relative alignment between patterns in a plane direction for forming a plurality of patterns in manufacturing a semiconductor device, a method for manufacturing a semiconductor device and a semiconductor device.

2. Description of the Background Art

Now discussion will be presented on alignment with reference to a conceptional diagram of FIG. 24. A plane 3a has patterns 1a and alignment marks 2a to 2d. A plane 3b has patterns 1b and alignment marks 2e to 2h. The patterns 1a and 1b are formed on wafers and made of silicon compound, metal or the like. The alignment marks 2a to 2d are formed simultaneously with the patterns 1a. The alignment marks 2e to 2h are formed simultaneously with the patterns 1b. An operation to relatively align positions of two objects, such as the planes 3a and 3b, is referred to just as "Alignment".

In a process for manufacturing a semiconductor device, several major steps are performed to manufacture the semiconductor device. The major step is a unit of a plurality of steps for forming a pattern (e.g., a film-formation step for forming a film on a wafer, a resist coating step for coating a resist, an exposure step, a developing step, an etching step for patterning a film and so on).

FIG. 25 is a conceptional section of a semiconductor device. The semiconductor device of FIG. 25 is obtained through seven major steps, and patterns 301 to 307 are formed through the seven major steps, respectively.

The alignment is required in the exposure step. In the exposure step, actually, an alignment is performed to relatively align the positions of a reticle and a wafer. Among apparatuses for exposure and alignment is a step-type projection aligner (hereinafter, referred to as "stepper").

FIG. 26 is a block diagram of a manufacturing system 10 for manufacturing a semiconductor device. This figure shows steppers 4 as mentioned above, overlay checking devices 5, a production control system body 6 for performing a production control which includes an alignment correction unit 6a and a database 6b, semiconductor manufacturing devices 7 and reference terminals 8 connected to the production control system body 6 for making reference to the database 6b. In this system, there are a plurality of steppers 4 and semiconductor manufacturing devices such as a sputtering device and an etching device.

Among patterns which are aligned by the stepper 4, there exist a shear despite of the alignment. This is due to a mechanical error of the stepper, a manufacture error of the reticle and so on. The stepper 4 is given a correction value for resolving the shear (hereinafter, referred to as "stepper correction value"). On the other hand, the overlay checking device 5 detects the shear and calculates a correction value for resolving the shear (hereinafter, referred to as "OCCV (overlay checking correction value)").

The production control system body 6 controls data on alignment (hereinafter, referred to as "alignment data"). The alignment data include the OCCV, the step correction value, the type of wafer (lot No., product No. and the like), date of alignment, processing, production history and so on. The alignment data are stored in the database 6b.

The alignment correction unit 6a is one of functions of the production control system body 6 and calculates the stepper correction value.

FIG. 27 illustrates a constitutional conception of the stepper 4. In this figure shown are a wafer stage WST on which a wafer 20 is mounted, a reticle stage RST on which a reticle 30 is mounted, an illumination system ILS, a lens system PL, a stepper correction value for wafer component 22 and a stepper correction value for shot component 33.

The stepper 4 receives the stepper correction value. The stepper correction value includes the stepper correction value for wafer component 22 and the stepper correction value for shot component 33.

The stepper correction value for wafer component 22 is a value which is set to move the wafer. The stepper correction values for wafer component 22 includes stepper correction values for offsets X and Y (base line), scalings X and Y, X-Y orthogonality and wafer rotation. The wafer stage WST travels in accordance with the stepper correction values for wafer component 22.

The stepper correction value for shot component 33 is a value which is set to change an image 34 projected on the wafer 20 from the illumination system ILS through the reticle 30. The stepper correction values for shot component 33 include stepper correction values for shot rotation, magnification and the like. The image 34 varies with the stepper correction values for shot component 33. In more detail, as to the shot rotation, the reticle stage RST rotates about a center axis 32 to rotate the image 34. As to the magnification, the image 34 is enlarged or reduced by the lens system PL and the like.

The production control system body 6 processes the wafer as follows. Herein, an alignment of the plane 304 of FIG. 25 will be taken as an example. The processing is performed according to a flowchart of FIG. 28.

First, the production control system body 6 transports a wafer to be processed to the stepper 4. When the wafer reaches the stepper 4, the alignment correction unit 6a calculates the stepper correction value (Step S901 of FIG. 28).

The production control system body 6 sets the stepper correction value obtained by calculation to the stepper 4 (Step S902).

The stepper 4 performs an alignment (Step S903).

After completing the alignment, the production control system body 6 registers the stepper correction value in the database 6b to control the stepper correction value. Further, the wafer is transported from the stepper 4 to the overlay checking device 5 (Step S904), The overlay checking device 5 detects a shear between the pattern 304 and the pattern 303 immediately therebelow with the positions of the alignment marks (Step S905). Further, the device 5 calculates the OCCV to resolve the detected shear (Step S906).

Subsequently, the production control system body 6 collects the OCCVs from the overlay checking devices 5 (Step S907). The system body 6 stores the collected OCCVs in the database 6b and controls them (Step S908).

Further, the production control system body 6 transports the wafer to be processed to the semiconductor manufacturing device 7, as needed, where sputtering, etching and the like are performed.

Through the above steps, the production control system body 6 processes the wafer.

Next, a method for correcting alignment to calculate the stepper correction value in the background art will be discussed with reference to FIGS. 29 and 30. It is assumed that the stepper correction value set in the Step S902 is +1 and the OCCV (which herein corresponds to the shear) detected in the Step S906 is −2 in this alignment performed in the major step. Therefore, as shown in FIG. 30, if the stepper correction value is set at +3 in the alignment of the next major step, it is expected that the OCCV should be 0. The calculated difference between the stepper correction value and the OCCV is referred to as "true shear". Specifically, this is expressed as, $$\text{true shear} = \text{stepper correction value} - \text{OCCV} \quad (1)$$

Shorter time lag between the present alignment and the next alignment causes smaller true shear.

As the time lag becomes longer, the true shear becomes larger. Then, the production control system body 6 controls a trend of the true shear in a major step as shown in FIG. 31, and the alignment correction unit 6a calculates a mean value of true shears at the time points P1 to P3 in the same major step as the stepper correction value to be set in the next major step tx.

Thus, in the background-art method for correcting alignment, the stepper correction value for wafer component is corrected to align a pattern with a pattern immediately therebelow, like the patterns 304 and 303.

For size reduction of a semiconductor device, a small tolerance (specification) of the shear between patterns is required. In recent, as the size of a semiconductor device becomes smaller, too much smaller tolerance has been established than ever. The shear between patterns used to be within specification if the stepper correction value for wafer component was corrected. With establishment of too much smaller tolerance, however, there recently arises a problem that some shear out of specification is caused when the background-art method for correcting alignment is performed, and an improvement in precision of alignment is required.

SUMMARY OF THE INVENTION

The present invention is directed to a method for correcting alignment used in a manufacturing system for manufacturing a semiconductor device including steppers to which stepper correction values are set to determine a position of a pattern to be aligned, by which the manufacturing system generates the stepper correction values. In the method, the manufacturing system manages in advance a lower pattern corresponding to the pattern to be aligned among a plurality of patterns in the semiconductor device. According to a first aspect of the present invention, the method comprises the steps of: (a) controlling the travel from a reference position to a position of the pattern to be aligned among the plurality of patterns in the semiconductor device by the manufacturing system; and (b) generating a value including the travel of the lower pattern corresponding to the pattern to be aligned as one of the stepper correction values to determine the position of the pattern by the manufacturing system.

According to a second aspect of the present invention, in the method of the first aspect, the stepper correction values in the step (b) represent shot components.

According to a third aspect of the present invention, in the method of the first aspect, the reference position is a position of the pattern at the time when the stepper correction values are zero.

According to a fourth aspect of the present invention, in the method of the third aspect further comprises the steps of: (c) detecting a shear between the pattern and the lower pattern corresponding thereto by a overlay checking device; and (d) adding the travel of a lower pattern corresponding to the lower pattern in the step (c) to the shear detected in the step (c) to obtain the travel of the lower pattern in the step (b).

According to a fifth aspect of the present invention, in the method of the first aspect, the manufacturing system manages in advance the reference position.

According to a sixth aspect of the present invention, in the method of the fifth aspect, the reference position is controlled by using reference stepper correction values, the reference stepper correction values are the stepper correction values set to the steppers to determine the reference position, and the method further comprises the step of: (c) subtracting the reference stepper correction values for the lower pattern from the stepper correction values set to determine a position of the lower pattern to obtain the travel of the lower pattern in the step (b).

According to a seventh aspect of the present invention, in the method of the first aspect, the stepper correction values include a stepper correction value for offset and a stepper correction value for shot rotation, the one of the stepper correction values generated in the step (b) is the stepper correction value for shot rotation, and the method further comprises the step of: (c) generating the stepper correction value for offset, and in the method, the travel is transformed into a variation of the stepper correction value for offset and the variation is added to the stepper correction value for offset in the step (c).

According to an eighth aspect of the present invention, the method of the first aspect further comprises the steps of: (c) comparing the stepper correction value with a predetermined threshold value; and (d) adding a value for reducing the stepper correction value to each of the stepper correction values when the each of the stepper correction values is not less than the threshold value as a result of the step (c).

The present invention is also directed to a method for manufacturing a semiconductor device. According to a ninth aspect of the present invention, the method comprises the step of positioning a pattern to be aligned by using the method for correcting alignment of the first to eighth aspects.

The present invention is further directed to a semiconductor device comprising a pattern aligned by using a method for correcting alignment, and the method for correcting alignment is used in a manufacturing system for manufacturing a semiconductor device including steppers to which stepper correction values are set to determine a position of a pattern to be aligned, by which the manufacturing system generates the stepper correction values. In the semiconductor device, the manufacturing system manages in advance a lower pattern corresponding to the pattern to be aligned among a plurality of patterns in the semiconductor device. According to a tenth aspect of the present invention, the method comprises the steps of: (a) controlling the travel from a reference position to a position of the pattern to be aligned among said plurality of patterns in the semiconductor device by the manufacturing system; and (b) generating a value including the travel of the lower pattern corresponding to the pattern to be aligned as one of the stepper correction values to determine the position of the pattern by the manufacturing system.

In the method of the first aspect of the present invention, by controlling the lower pattern and the travel of the lower pattern, it is possible to generate the stepper correction values including the travel of the lower pattern to determine the position of the upper pattern to be aligned. Therefore, the method produces an effect of preventing any shear out of specification between the upper and lower patterns.

Since the shot components are generally more likely to cause a shear than the wafer components, applying the method of the second aspect of the present invention produces an effect of preventing any shear out of specification between the upper and lower patterns.

In the method of the third aspect of the present invention, since the reference position for travel is the position of the pattern at the time when the stepper correction values are zero, the stepper correction values can be easily calculated.

The method of the fourth aspect of the present invention produces an effect of obtaining the travel by calculation using the shear detected by the overlay checking device.

In the method of the fifth aspect of the present invention, when the reference position controlled in advance is a position of the pattern at an initial state, the travel is the variation from the time point of initial state. Therefore, the relatively-positional relation between the pattern to be aligned and the lower pattern is made equivalent to the relatively-positional relation at the initial state.

The method of the sixth aspect of the present invention produces an effect of obtaining the self-variation by subtracting the stepper correction values for the lower pattern at the initial state from the stepper correction values set to determine the position of the lower pattern.

The method of the seventh aspect of the present invention produces an effect of preventing any offset out of specification.

By the method of the eighth aspect of the present invention, the stepper correction value over the threshold value is reduced. Therefore, the method produces an effect of preventing out-of-specification caused by abruptly setting a large stepper correction value.

The method of the ninth aspect of the present invention produces an effect of providing a semiconductor device having patterns which are positioned with high precision.

The method of the tenth aspect of the present invention produces an effect of providing a semiconductor device having patterns which are positioned with high precision.

An object of the present invention is to provide a method for correcting alignment which prevents any shear out of specification, a method for manufacturing a semiconductor device and a semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 10 and 11 show examples of contents of a database displayed on a reference terminal in accordance with the first preferred embodiment of the present invention;

FIG. 12 illustrates a self-magnification;

FIGS. 17 and 18 show examples of contents of a database displayed on the reference terminal in accordance with the third preferred embodiment of the present invention;

FIG. 19 shows relatively-positional relation between the lower and upper patterns at the initial state;

DESCRIPTION OF THE PREFERRED EMBODIMENTS

The First Preferred Embodiment

Figure 26:
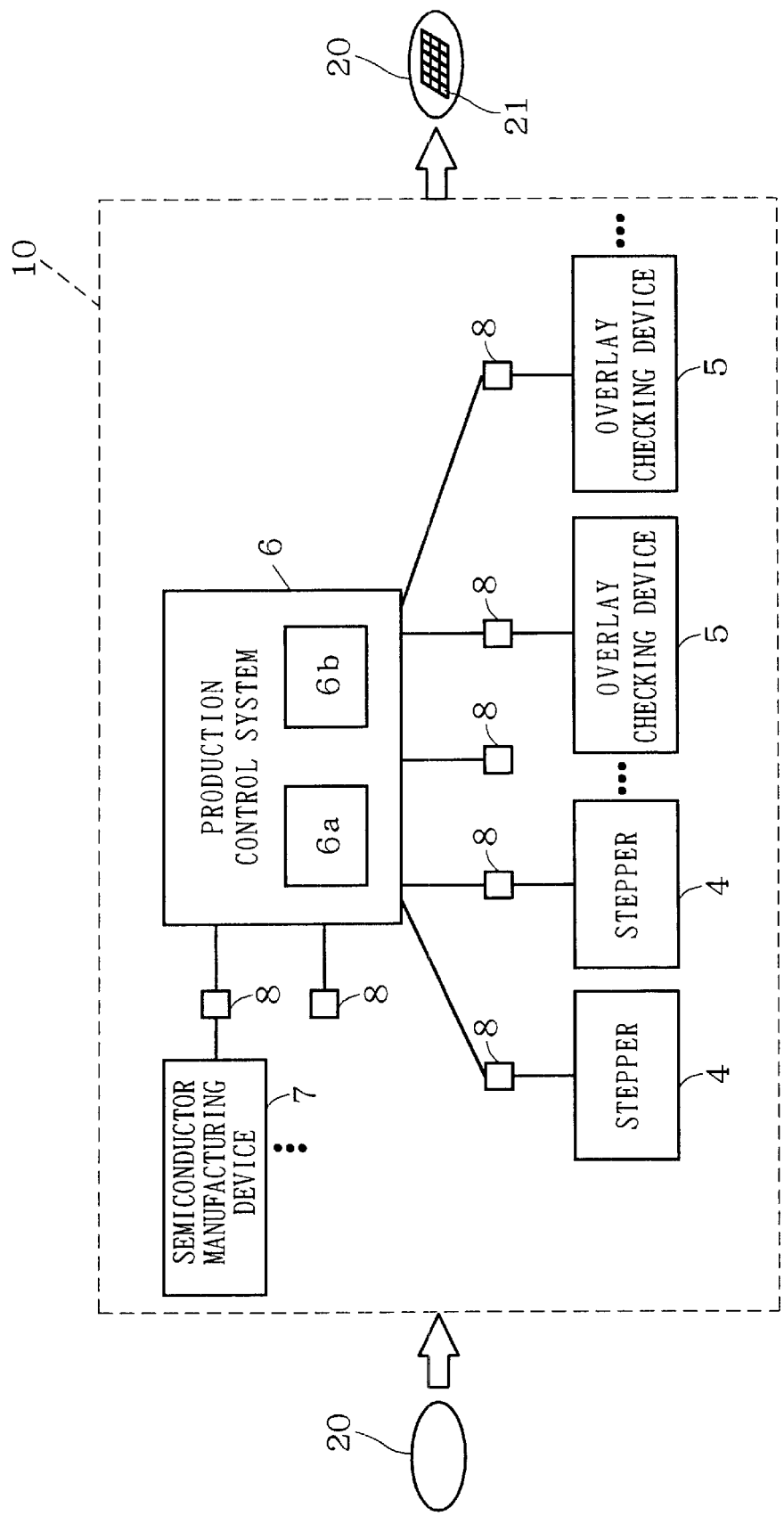
FIG. 26 is a block diagram showing a production control system for controlling manufacture of the semiconductor device.
Figure 27:
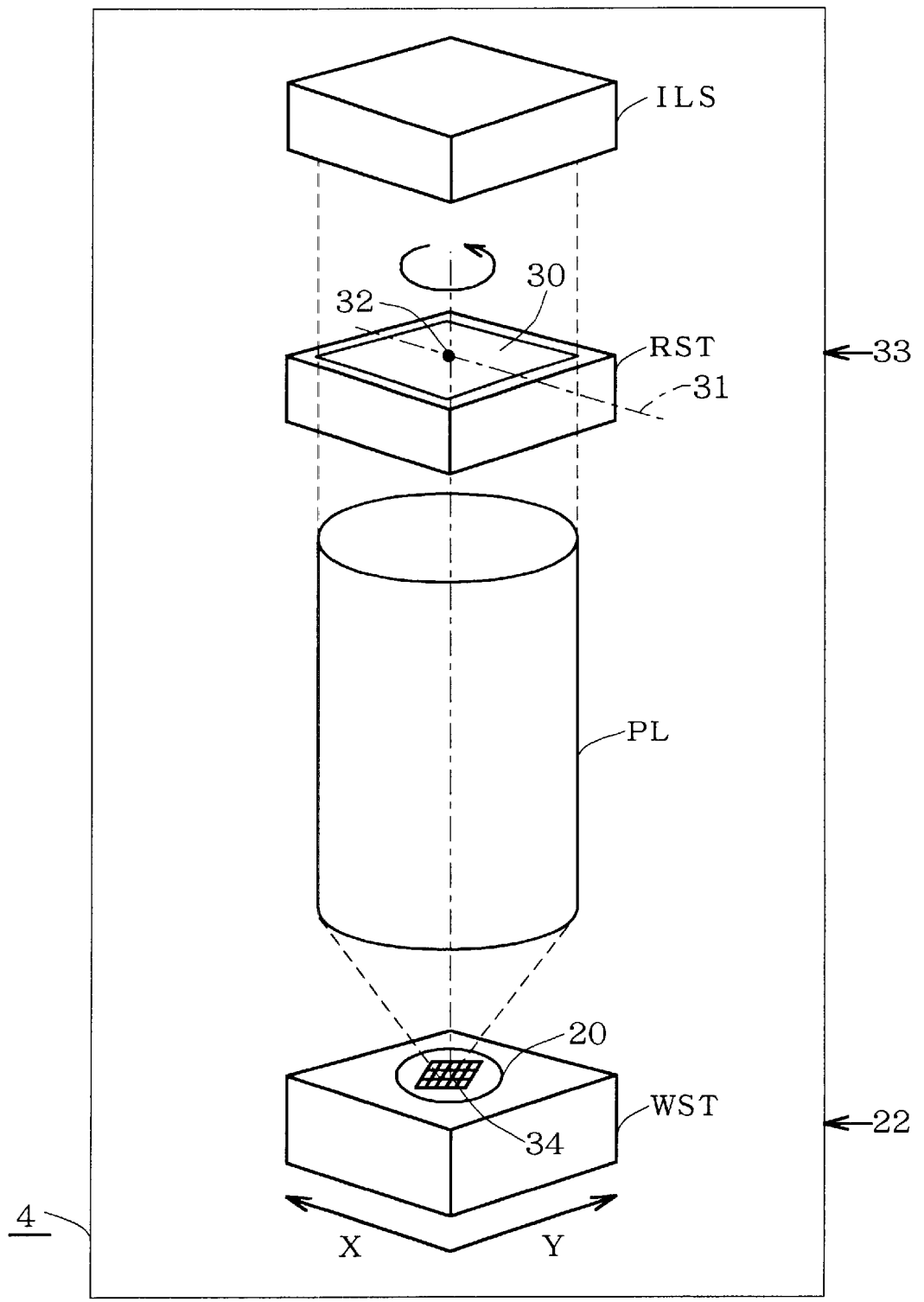
FIG. 27 illustrates a constitutional conception of a stepper 4.
Figure 28:
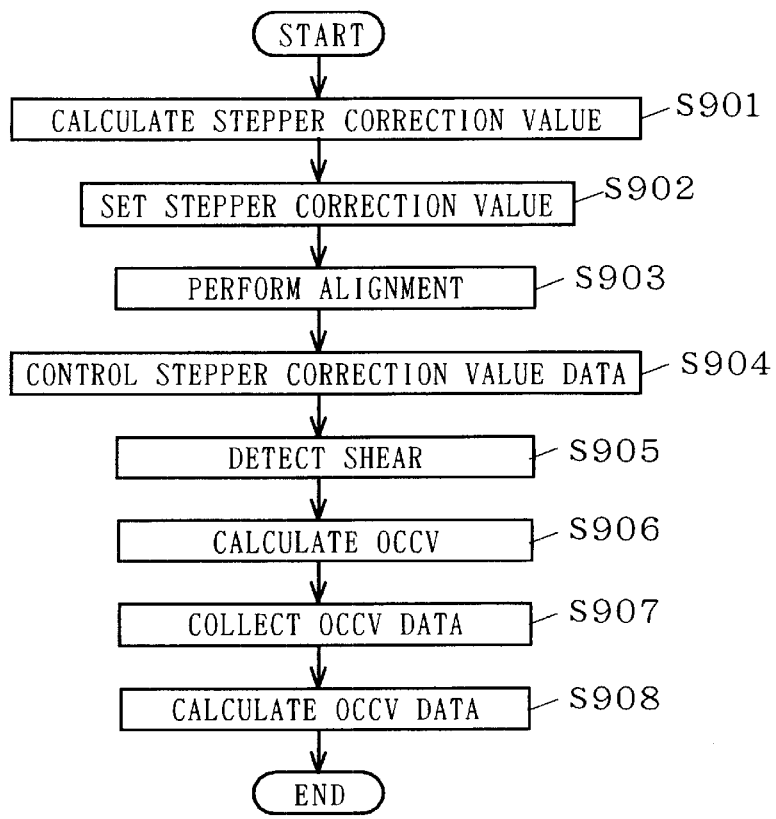
FIG. 28 is a flowchart showing a method for correcting alignment in the background art.
Figure 29:
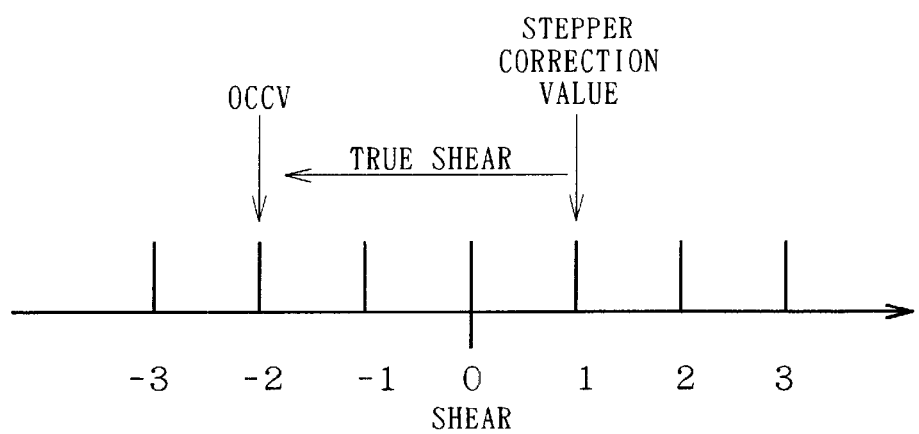
FIGS. 29 to 31 are views used for describing the method for correcting alignment in the background art.
Figure 30:
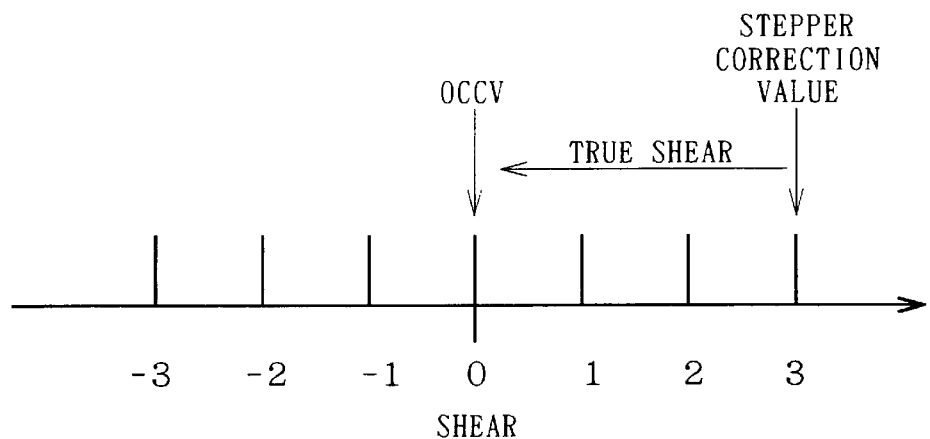
Figure 31:
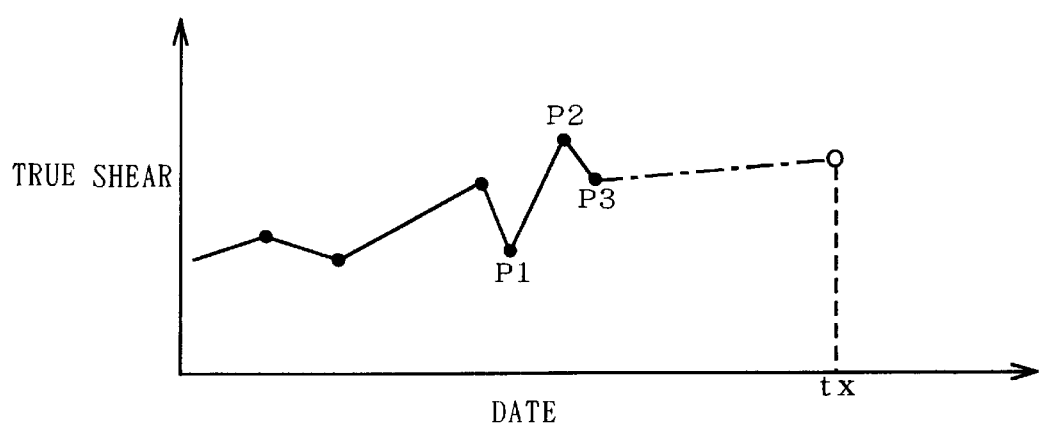

Discussions on all the preferred embodiments will be presented, taking the manufacturing system 10 of FIG. 26. The manufacturing system 10 of FIG. 26 includes the steppers 4 to which the stepper correction values are set to determine the position of a pattern. The stepper 4 has, for example, the constitution of FIG. 27. A difference from the background art is laid in a method for correcting alignment performed by the production control system body 6.

Figure 1:
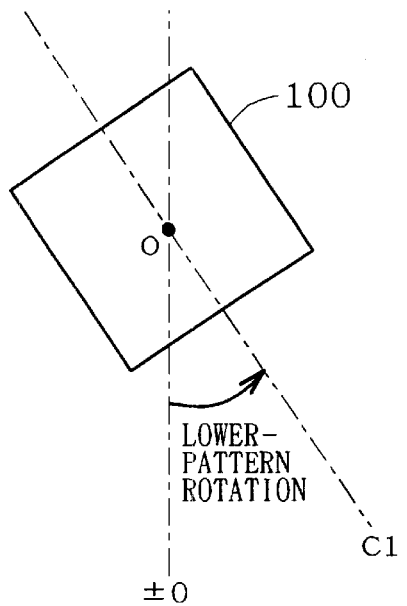
FIG. 1 shows an example of a lower pattern.

The following discussion will be made on an alignment of an upper pattern with a lower pattern. FIG. 1 shows a lower pattern 100. An axis of ±0 is the central axis of the lower pattern at the time when the stepper correction value for shot rotation is zero, and is hereafter referred to as a reference axis.

The lower-pattern rotation, referring to the position of the central axis C1 of the lower pattern, is the travel from the position of the reference axis ±0 to the position of the central axis C1 of the lower pattern.

In order to align the upper pattern with the pattern 100, without regard for any error, the lower-pattern rotation is set to the stepper 4 as the stepper correction value. Specifically, this is expressed as, $$\text{stepper correction value} = \text{lower-pattern rotation} \qquad (2)$$

Figure 2:
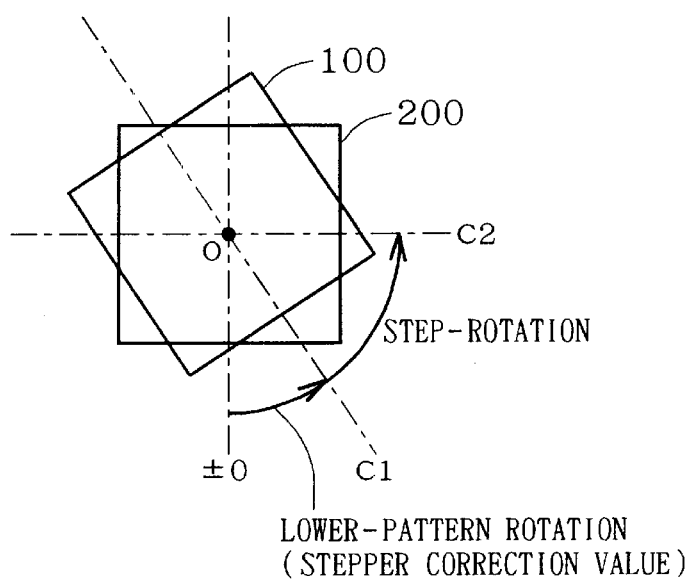
FIG. 2 shows a state after an alignment of an upper pattern.

Seeing the state after performing the alignment of an upper pattern 200 with the stepper correction value obtained by Equation (2) set to the stepper 4, there exists a shear between the central axis C1 of the lower pattern 100 and a central axis C2 of the upper pattern 200 as shown in FIG. 2. In other words, the pattern 200 travels from the position of the central axis C1 which is set by the stepper correction value. The rotation from the position set by the stepper correction value is referred to as a step-rotation.

The step-rotation is caused by manufacturing error of the reticle, mechanical error, measurement error and the like. These errors, which are relatively connected to one another, may be grouped together into one as the step-rotation.

Figure 3:
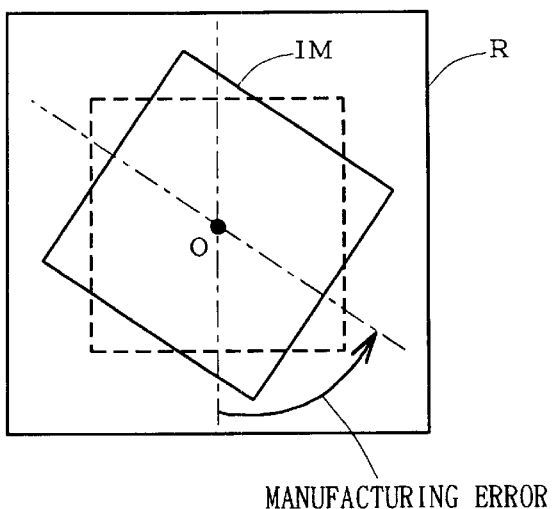
FIG. 3 illustrates a step-rotation.

A main cause of the step-rotation is the manufacturing error of the reticle. FIG. 3 shows the manufacturing error of the reticle. The manufacturing error of a reticle R is a difference between a normal position of a pattern image IM indicated by the broken line and the actual position of the pattern image IM.

In order to prevent the shear between the patterns 100 and 200, it is necessary to set a value obtained by subtracting the step-rotation from the lower-pattern rotation as the stepper correction value. Specifically, Equation (2) is changed as $$\text{stepper correction value} = \text{lower-pattern rotation} - \text{step-rotation} \quad (3)$$

Figure 4:
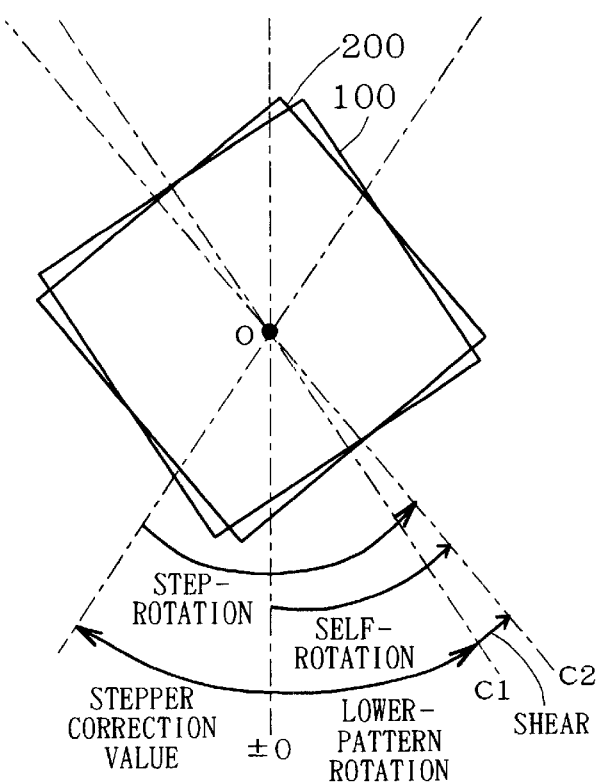
FIG. 4 illustrates a self-rotation.

Seeing the state after performing the alignment of the upper pattern 200 with the stepper correction value obtained by Equation (3) set to the stepper 4, there still exists a shear between the central axis C1 of the lower pattern 100 and the central axis 200 of the upper pattern 200, as shown in FIG. 4, but the shear is smaller than that of FIG. 2.

Since the mechanical error and the measurement error vary with time, the step-rotation also varies with time. Therefore, in consideration of a trend of the step-rotation to time, Equation (3) is chanted as $$\text{stepper correction value} = \text{lower-pattern rotation} - f(\text{step-rotation}) \quad (4)$$

where f is a trend function, such as arithmetic average (e.g., f=(the last step-rotation+the before-last step-rotation)/2), weighted average (e.g., f=the last step-rotation ×2/3+ the before-last step-rotation /3), exponential smoothing (e.g., f=the last step-rotation×0.97+the before-last step-rotation× 0.03).

The alignment correction unit 6a calculates the stepper correction value on the basis of the foregoing factors. The lower-pattern rotation and the step-rotation can be obtained as follows.

Since the lower-pattern rotation can not be directly measured in some cases, it can be obtained by calculation as follows. First, the self-rotation is defined. For example, referring to FIG. 4, the self-rotation of the upper pattern 200 is a sum of the lower-pattern rotation which is a rotation of the lower pattern 100 and the shear (or OCCV) between the patterns 100 and 200 detected by the overlay checking device 5, i.e., the rotation (travel) from the position of the reference axis ±0 obtained by calculation. Specifically, this is expressed as, $$\text{self-rotation} = \text{lower-pattern rotation} + \text{OCCV} \quad (5)$$

Figure 5:
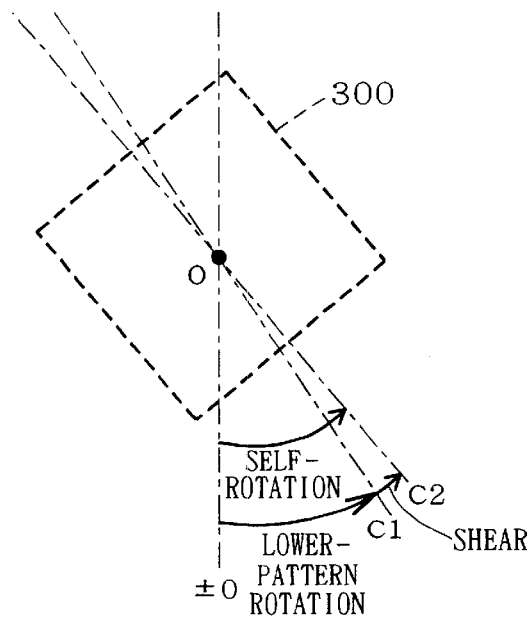
FIG. 5 illustrates a lower-pattern rotation.

Further, in order to align a pattern 300 of FIG. 5, which is upper, with the pattern 200 which is lower, the self-rotation of the pattern 200 is the lower-pattern rotation of the pattern 300 itself. In other words, the self-rotation of the pattern 200 below the pattern 300 is the sum of the self-rotation of the pattern 100 below the pattern 200 and the shear (OCCV) between the patterns 100 and 200.

Referring to FIG. 4, the step-rotation of the pattern 200 can be obtained by vector calculation using the lower-pattern rotation, OCCV and the stepper correction value. Specifically, this is expressed as, $$\text{step-rotation} = \text{lower-pattern rotation} - \text{stepper correction value} + \text{OCCV} \quad (6)$$

Figure 6:
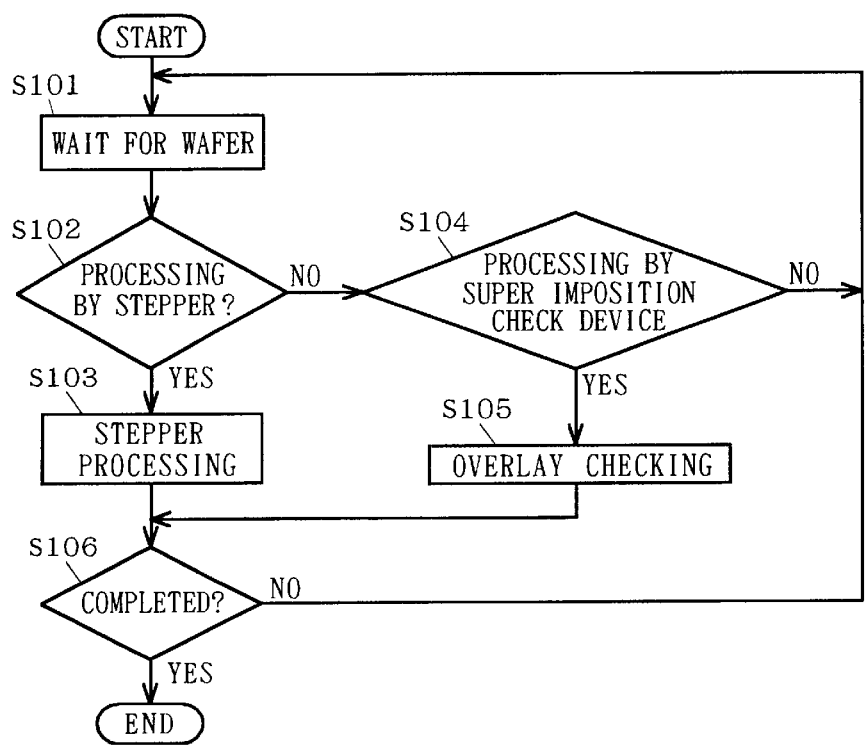
FIGS. 6 to 9 are flowcharts showing a method for correcting alignment in accordance with a first preferred embodiment of the present invention.
Figure 7:
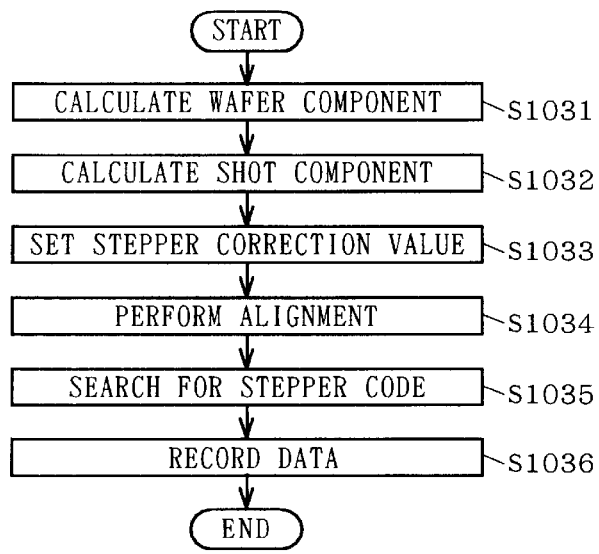
Figure 8:
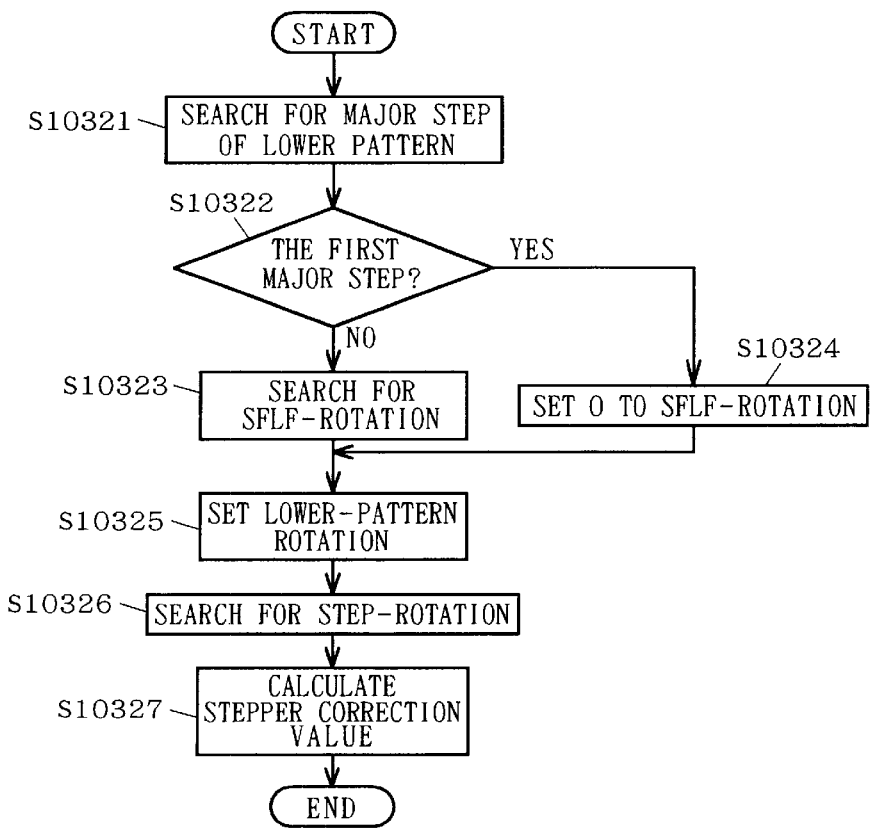
Figure 9:
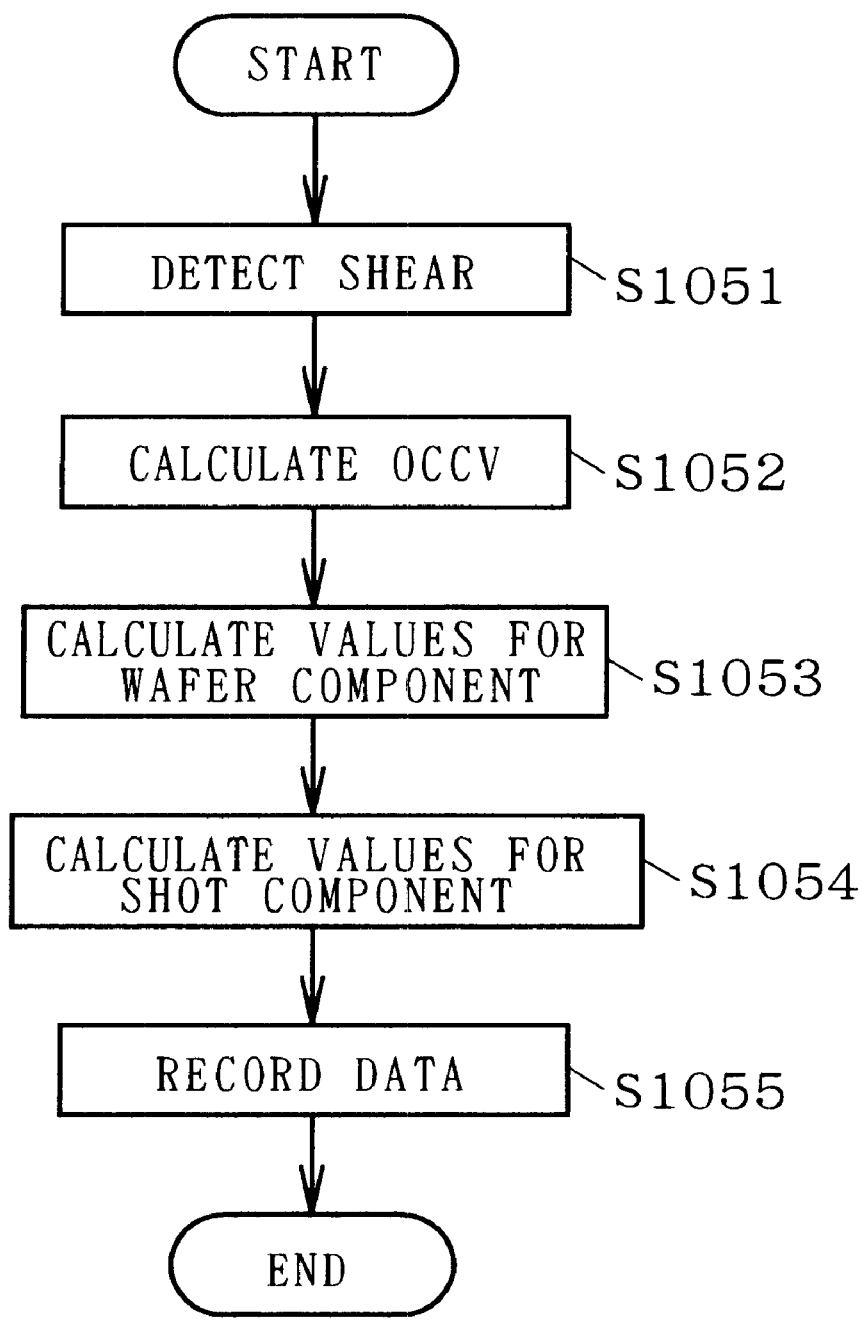

FIG. 6 is a flowchart showing a main operation of the production control system body 6 of the present invention, FIG. 7 is a flowchart for detailed description of Step S103 of FIG. 6, FIG. 8 is a flowchart for detailed description of Step S1032 of FIG. 7, and FIG. 9 is a flowchart for detailed description of Step S105 of FIG. 6.

Figures 11, 12:
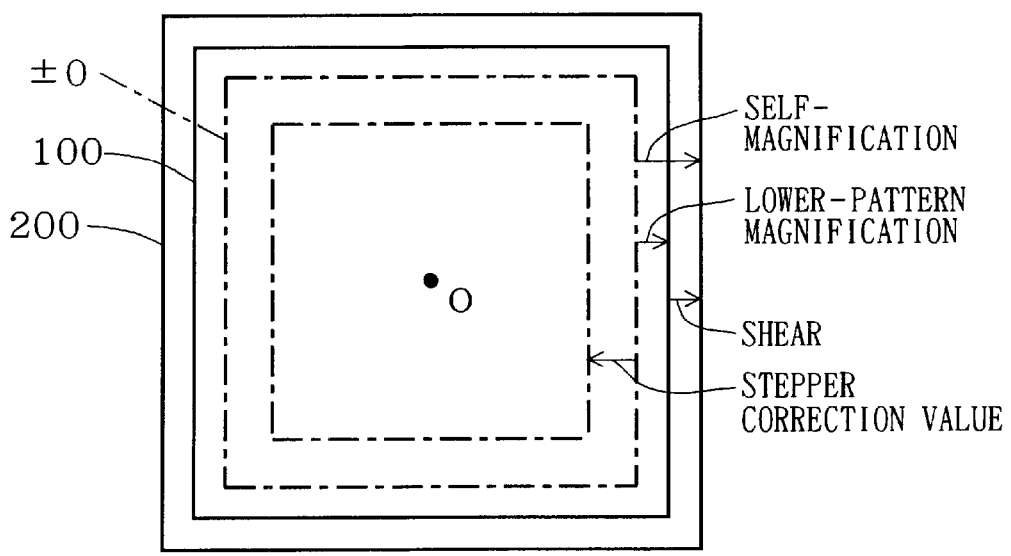

The contents of the database 6b can be referred to with the reference terminal 8. FIGS. 10 and 11 show examples of the contents of the database 6b displayed on the reference terminal 8. The production control system body 6 controls or manages history data of FIG. 10 on alignment in the database 6b.

Further, the production control system body 6 controls major steps of the lower pattern corresponding to major steps of the upper pattern of FIG. 11 in the database 6b. This correspondence is predetermined by an operator and the like.

The following discussion will be presented, taking a case where the production control system body 6 processes a wafer.

The stepper 4 and the overlay checking device 5 are waiting for arrival of the wafer to be processed (Step S101 of FIG. 6).

The production control system body 6 transports the wafer to an available stepper 4. When the wafer reaches the stepper 4 after judgment as to whether the wafer should be processed by the stepper 4 or not (Step S102), a processing is made by the stepper 4 (Step S103).

The processing of Step S103 is shown in FIG. 7. The production control system body 6 calculates the stepper correction value for wafer component among the stepper components. The calculation is carried out by the same method as the background-art one, so discussion thereof will be omitted (Step S1031).

Next, the production control system body 6 calculates the stepper correction value for shot component among the stepper components (Step S1032). The processing of Step S1032 is shown in FIG. 8. The production control system body 6 detects the major step of the lower pattern (Step S10321). The production control system body 6 searches the correspondences in the database 6b of FIG. 11 for the major step of the lower pattern based on the type of the wafer and the major step of the upper pattern. Further, since the major step of the upper pattern is herein the first major step, as the result of the search, no major step of the lower pattern is found.

Next, the production control system body 6 judges if the major step of the upper pattern is the first major step (Step S10322). The production control system body 6 detects the self-rotation of the lower pattern when the major step of the upper pattern is not the first major step (Step S10323). On the other hand, when the major step of the upper pattern is the first major step, it is determined that the self-rotation is zero (Step S10324). Subsequently, the production control system body 6 sets the self-rotation of the lower pattern to the lower-pattern rotation (Step S10325).

The production control system body 6 detects the step-rotation in the past. The production control system body 6 searches the history data of FIG. 10 for the step-rotation in the past based on the type of the wafer, the major step of the upper pattern, the major step of the lower pattern, specific code of the stepper device used for the alignment of the upper pattern (hereinafter, referred to as "stepper code"), stepper code used for the alignment of the lower pattern, the latest exposure date in a predetermined range from the present time (Step S10326).

Subsequently, the production control system body 6 calculates the stepper correction value (herein, for shot rotation: S) from Equation (4). When calculation is impossible because of no history data, the production control system body 6 obtains the stepper correction value of zero (Step S10327).

The production control system body 6 sets the stepper correction values for wafer component and shot component (Step S1033 of FIG. 7).

Next, the stepper 4 performs an alignment (Step S1034).

The production control system body 6 detects the stepper code used in the major step of the lower pattern. The stepper code for the lower pattern is obtained by searching the history data of FIG. 10 (Step S1035).

The data related to the above steps S1031 to S1035, i.e., the lot No., the type of a wafer, the major steps of the upper and lower patterns, the stepper codes for the upper and lower patterns, the exposure date, the stepper correction value and the lower-pattern rotation in the first preferred embodiment are recorded in the database 6b for control (Step S1036).

After Step S103, the production control system body 6 starts Step S105 through Steps 101, 102 and 104. Specifically, after Step S103, the production control system body 6 transports the wafer to an available overlay checking device 5. When the wafer reaches the overlay checking device 5 after judgment as to whether the wafer should be performed by the overlay checking device 5 or not (Step S104), a processing is made by the overlay checking device 5 (Step S105).

The processing of Step S105 is shown in FIG. 9. The overlay checking device 5 detects a shear between the upper and lower patterns (Step S1051). The device 5 calculates an OCCV for wafer component such as offset and shot component such as shot rotation from the shear (Step S1052). The OCCV for the shot rotation is refereed to as K.

The production control system body 6 receives the OCCV for the wafer component and calculates data required for calculating the stepper correction value for wafer component to be set in the next alignment from the OCCV. This calculation is performed in the same manner as the background-art one, so discussion thereof will be herein omitted (Step S1053).

Further, the production control system body 6 receives the OCCV for shot component and calculates data required for calculating the stepper correction value for shot component (herein, S) to be set in the next alignment, i.e., the OCCV, the true shear, the step-rotation, the self-rotation, from the OCCV. The true shear, the step-rotation, the self-rotation are obtained by using Equations (1), (5) and (6), respectively (Step S1054).

The data related to the above steps S1051 to S1055, i.e., the OCCV, the true shear, the step-rotation and the self-rotation are recorded in the database 6b in addition to those recorded in Step S1036 for control (Step S1055).

Also in the later major steps, the second major step, the third major step . . . , for the wafer, Steps S103 and S105 are performed. After performing all the major steps for the wafer (Step S106), the processing for the wafer is completed.

Thus, the production control system body 6 controls the lower patterns corresponding to a plurality of patterns (the upper pattern of FIG. 11) in the semiconductor device. The production control system body 6 controls the self-rotation in Step S105. Further, in order to determine the position for the upper pattern, the production control system body 6 generates a value including the self-rotation of the lower pattern corresponding to the upper pattern as the stepper correction value in Step S103.

The first preferred embodiment produces the following effects. The production control system body 6 controls upper and lower patterns which have to be aligned with a shear within specification and the self-rotation of the lower pattern, and thereby generates a value including the self-rotation of the lower pattern (the lower-pattern rotation) as the stepper correction value to determine the position of the upper pattern. Therefore, it is possible to prevent any shear out of specification between the lower and upper patterns.

Assuming that the reference position for the lower-pattern rotation is the position of the pattern at the time when the stepper correction value is zero, without regard for the step-rotation, the stepper correction value can be obtained from the simple equation such as Equation (2).

It is possible to obtain the self-rotation by calculation from the shear detected by the overlay checking device. When a pattern has no lower pattern, for example, in the first major step, it is necessary to set a predetermined value (e.g., zero) to the self-rotation of the pattern having no lower pattern.

The Second Preferred Embodiment

In the first preferred embodiment, the discussion is made on the shot rotation among the shot components. In the second preferred embodiment, discussion will be made on magnification among the shot components.

The second preferred embodiment is like the first preferred embodiment. Specifically, in the second preferred embodiment, a reference frame, a lower-pattern magnification, a step-magnification and a self-magnification, as defined below, are used, instead of the reference axis, the lower-pattern rotation, the step-rotation and the self-rotation of the first preferred embodiment, respectively.

The reference frame is a frame indicated as ±0 of FIG. 12, referring to the position of a fringe of the lower pattern at the time when the stepper correction value for magnification is zero.

The lower-pattern magnification, referring to the position a fringe of the lower pattern, is the travel from the position of the reference frame ±0 to the position of the fringe of the lower pattern, as shown in FIG. 12.

The self-magnification is a sum of the lower-pattern magnification which is a magnification of the lower pattern 100 and the shear between the patterns 100 and 200 detected by the overlay checking device 5 (or the OCCV), with reference to FIG. 12, in other words, the travel from the position of the reference frame ±0 obtained by calculation.

Figure 13:
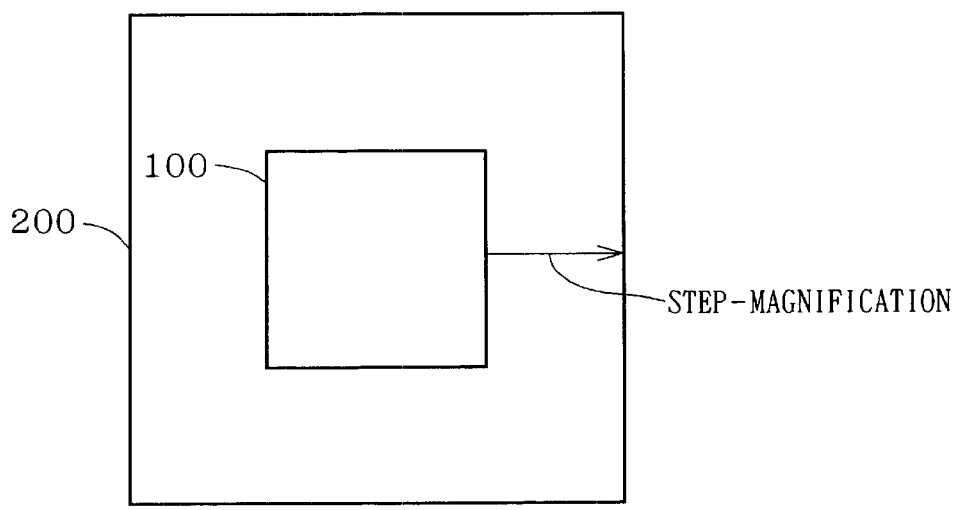
FIG. 13 illustrates a step-magnification.

The step-magnification is the travel from the position set by the stepper set value. For example, seeing the state after performing the alignment of the upper pattern 200 with the self-magnification of the lower pattern 100 set to the stepper,. there exists a shear between the lower pattern 100 and the upper pattern 200 as shown in FIG. 13. In other words, the pattern 200 travels from the position set by the stepper correction value. The travel from the position set by the stepper correction value is referred to as the step-magnification.

The second preferred embodiment produces the same effects as the first preferred embodiment, replacing the reference axis, the lower-pattern rotation, the step-rotation and the self-rotation of the first preferred embodiment by the reference frame, the lower-pattern magnification, the step-magnification the self-magnification, respectively.

The Third Preferred Embodiment

In the first preferred embodiment, when an upper pattern is aligned on a lower pattern, the stepper correction value is obtained by calculation on the basis of the self-rotation of the lower pattern (the lower-pattern rotation). Further, the self-rotation of the lower pattern is obtained by calculation on the basis of the detection result of the overlay checking device 5.

There is a case, however, where the shear of the lower pattern can not be detected by the overlay checking device 5. In this case, since the self-rotation of the lower pattern can not be obtained, it is impossible to calculate the stepper correction value.

Then, in the third preferred embodiment, discussion will be made on a method of calculating the stepper correction value which is useful when the self-rotation of the lower pattern can not be obtained.

Figure 14:
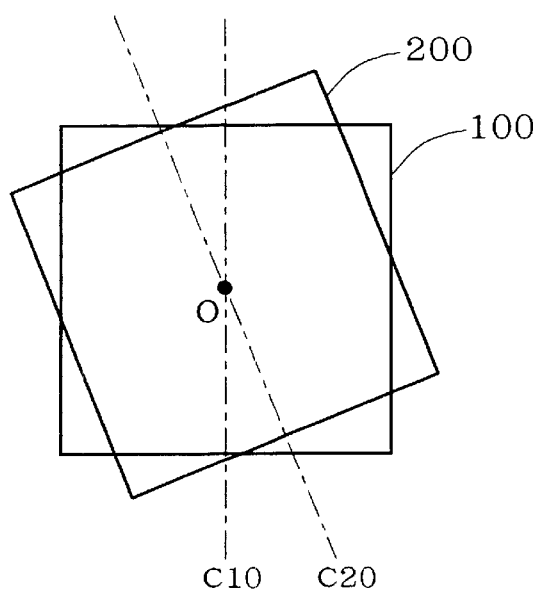
FIG. 14 shows relatively-positional relation between the lower and upper patterns at an initial state.
Figure 15:
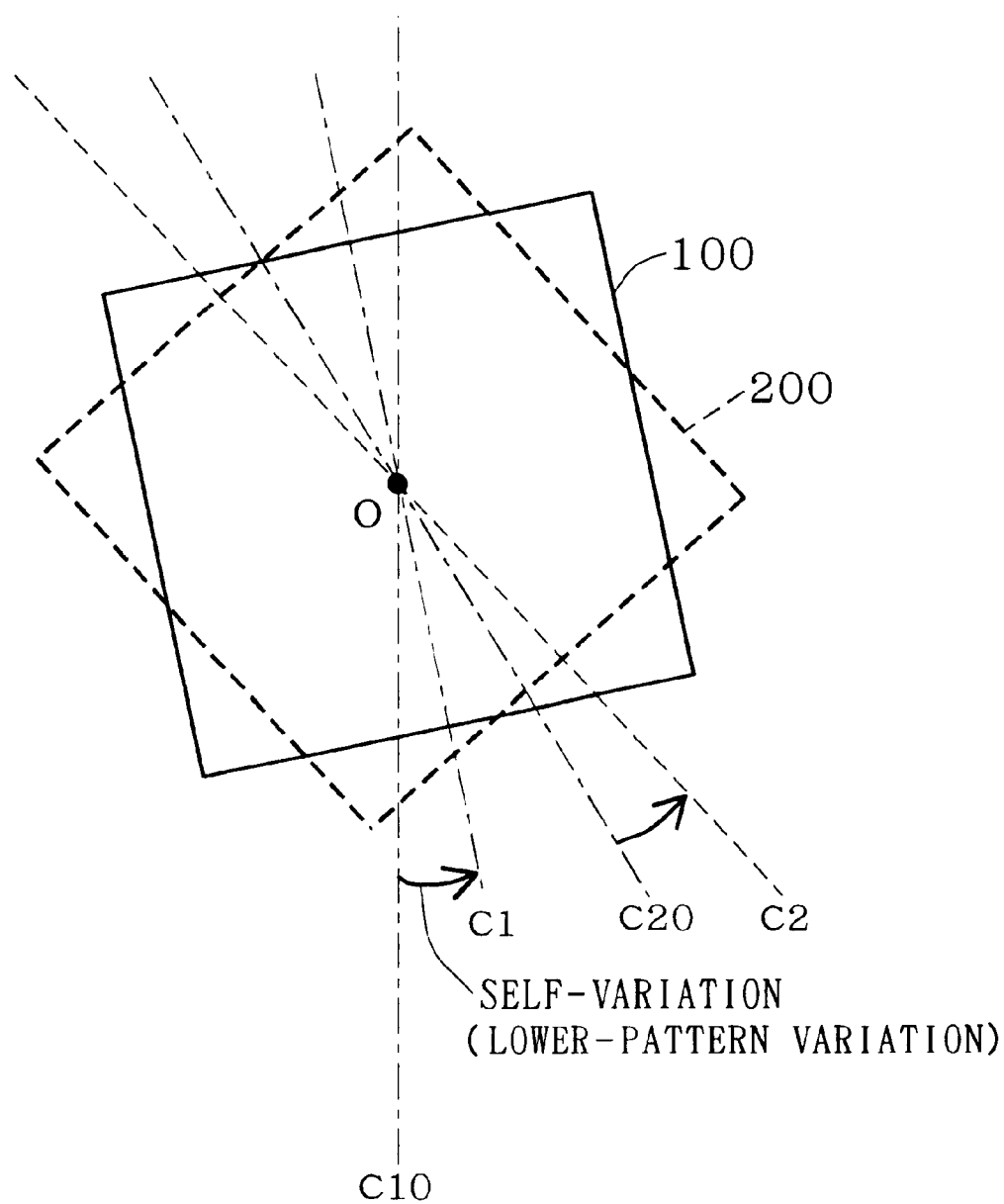
FIG. 15 illustrates a self-variation.

FIG. 14 illustrates a semiconductor device which is manufactured first, specifically, a relatively-positional relation between the lower pattern 100 and the upper pattern 200 at an initial state. As some semiconductor devices are manufactured thereafter, the stepper correction value varies. FIG. 15 illustrates an intermediate stage of a process for manufacturing the somethingth semiconductor device, where the alignment of the pattern 200 is about to start. FIG. 14 shows a central axis C10 of the pattern 100 at the initial state and a central axis C20 of the pattern 200 at the initial state. The central axes C10 and C20 of FIG. 15 correspond to those of FIG. 14.

The self-variation is the travel from the position of the central axis C10 which is a reference axis to the central axis C1 of the pattern 100 as shown in FIG. 15. The self-variation of the lower pattern is referred to as the lower-pattern variation.

In FIG. 15, when the upper pattern is aligned with the lower pattern, the upper pattern is rotated according to the lower-pattern variation.

The self-variation is obtained by calculation, as self-variation= stepper correction value−initial value of stepper correction value (7)

For example, the self-variation of the pattern 100 (the lower-pattern variation) is a value obtained by subtracting the stepper correction value of the pattern 100 set to the stepper at the state of FIG. 15 from the stepper correction value of the pattern 100 set to the stepper at the state of FIG. 14.

In the state of FIG. 15, the stepper correction value set to the stepper for alignment of the pattern 200 is obtained by adding the lower-pattern variation to the background-art stepper correction value (stepper correction value=f(true shear)). Specifically, this is expressed as, stepper correction value=f(true shear)+lower-pattern variation (8)

The true shear of the pattern 200 is obtained by subtracting the lower-pattern variation from Equation (1), as true shear=stepper correction value−OCCV−lower-pattern variation (9)

Figure 16:
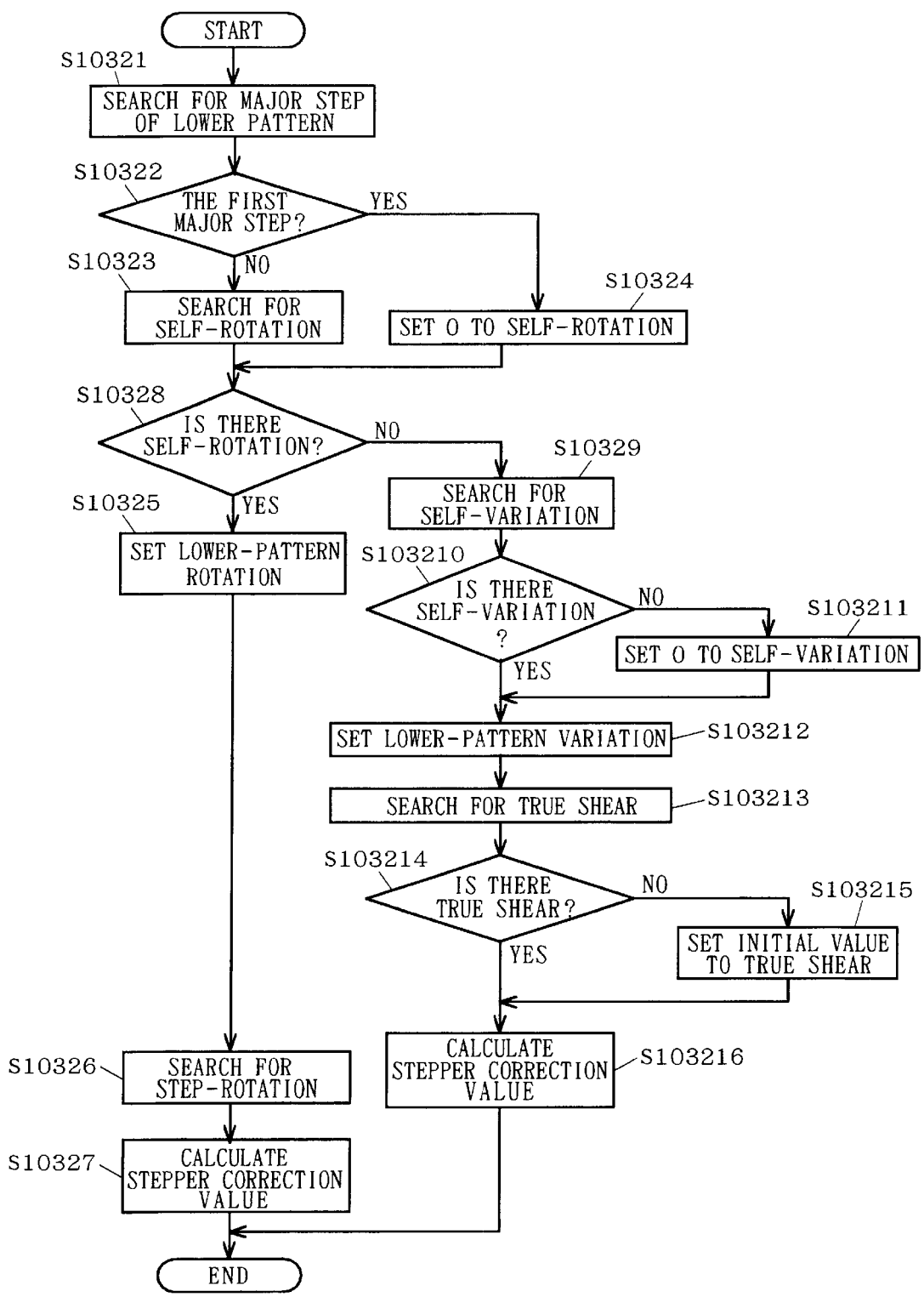
FIG. 16 is a flowchart showing a method for correcting alignment in accordance with a third preferred embodiment of the present invention.

The production control system body 6 in the third preferred embodiment performs the same main operation as that in the first preferred embodiment, and in addition to Steps of FIG. 8, performs Steps S10328 to S103216 of FIG. 16.

Figures 18, 19:
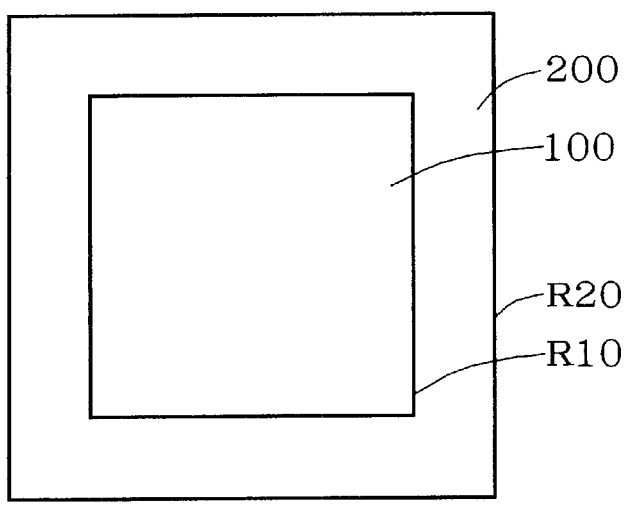

FIGS. 17 and 18 show examples of contents of the database 6b displayed on the reference terminal 8. The production control system body 6 controls the history data on alignment of FIG. 17 in the database 6b.

Further, the production control system body 6 controls the major steps for the lower pattern corresponding to major steps for an upper pattern and the initial values indicating the positions of the lower pattern at the initial state of FIG. 18 in the database 6b. The initial value is the stepper correction value set to the stepper 4 at the initial state to determine the position of the pattern.

With reference to FIG. 16, the production control system body 6 judges whether there is self-rotation or not. When the found self-rotation is represented by a predetermined sign (e.g., "nothing"), it is judged that there is no self-rotation and otherwise it is judged that there occurs self-rotation (Step S10328).

When it is judged that there is no self-rotation, the production control system body 6 detects the self-rotation of the lower pattern (Step S10329). The production control system body 6 searches the history data of FIG. 17 for the self-rotation of the lower pattern based on the type of the wafer and the major step of the lower pattern detected in Step S10321 and set to the major step of the upper pattern.

Next, the production control system body 6 judges whether there is self-variation or not. When the found self-variation is represented by a predetermined sign (e.g., "nothing"), it is judged that there is no self-variation and otherwise it is judged that there occurs self-variation (Step S103210).

When it is judged that there is no self-variation, the self-variation is assumed to be zero (Step S103211).

Subsequently, the production control system body 6 sets the self-variation as the lower-pattern variation (Step S103212).

Next, the production control system body 6 detects the true shear in the past. The production control system body 6 searches the history data of FIG. 17 for the past true shear based on the type of the wafer, the major step of the upper pattern, the major step of the lower pattern, the stepper code for the upper pattern, the stepper code for the lower pattern and the latest exposure date in a predetermined range from the present time (Step S103213).

Next, the production control system body 6 judges whether there is true shear or not. When the found true shear is represented by a predetermined sign (e.g., "nothing"), it is judged that there is no true shear and otherwise it is judged that there occurs true shear (Step S103214).

When it is judged there is no true shear, the production control system body 6 assumes the true shear to be the initial value (Step S103215).

Subsequently, the production control system body 6 calculates the stepper correction value (herein, for shot rotation: S) from Equation (8) (Step S103216).

In Step S1036 of the third preferred embodiment, the data related to the above steps S1031 to S1036, i.e., the lot No., the type of a wafer, the major step of the upper pattern, the stepper codes for the upper and lower patterns, the exposure date for alignment, the stepper correction value and the lower-pattern rotation and the lower-pattern variation are recorded in the database 6b for control. In Step S1054 of FIG. 9, the production control system body 6 receives the OCCV for shot component and calculates data required for calculating the stepper correction value for shot component (herein, S) to be set in the next alignment, i.e., the OCCV, the true shear and the step-variation when there is no self-rotation, from the OCCV. When there is no self-rotation, the true shear and the step-variation are obtained by using Equations (9) and (7), respectively. Further, in Step S1036, the data related to Steps S1051 to S1055, i.e., the OCCV, the true shear, the step-rotation, the self-rotation and the self-variation are recorded in the database 6b in addition to those recorded in Step S1036 for control.

The third preferred embodiment produces the following effects. The production control system body 6 controls upper and lower patterns which have to be aligned with a shear within specification and the self-variation of the lower pattern, and thereby generates a value including the self-variation of the lower pattern (the lower-pattern variation) as the stepper correction value to determine the position of the upper pattern. Therefore, it is possible to prevent any shear out of specification between the lower and upper patterns.

Since the reference position is the position at the initial state, the self-variation is the travel from the position at the initial state. Therefore, it is possible to make the relatively-positional relation between the pattern 100 and 200 (FIG. 15) equivalent to that between the patterns 100 and 200 at the initial state (FIG. 14).

A difference between the stepper correction value set to determine the position of the lower pattern and the stepper correction value of the lower pattern at the initial state, i.e., the self-variation can be obtained by calculation from Equation (7).

The Fourth Preferred Embodiment

In the third preferred embodiment, the discussion is made on the shot rotation among the shot components. In the fourth embodiment, discussion will be made on magnification among the shot components.

The fourth preferred embodiment is like the third preferred embodiment. Specifically, in the fourth preferred embodiment, the self-variation of magnification and the lower-pattern variation of magnification, as defined below, are used, instead of the self-variation of shot rotation, the lower-pattern variation of shot rotation of the third preferred embodiment, respectively.

Figure 20:
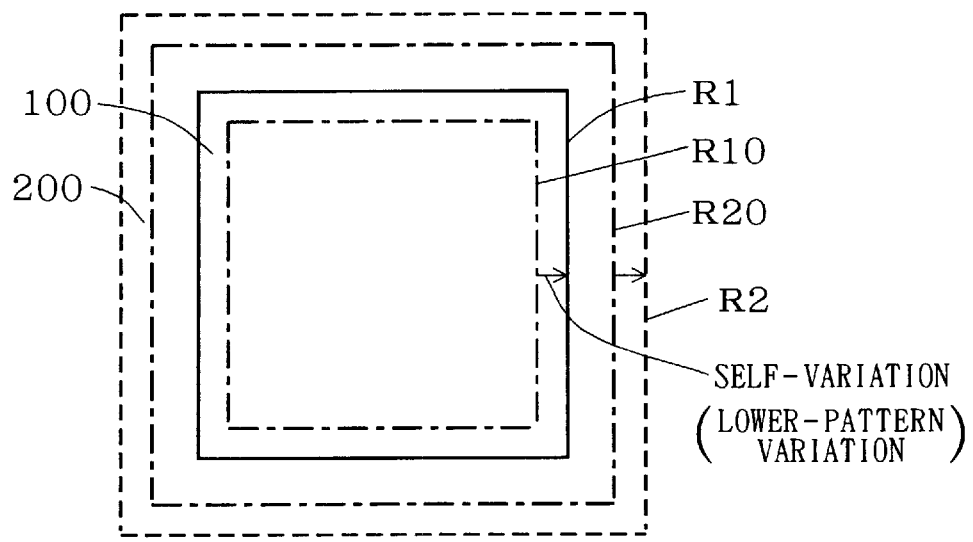
FIG. 20 illustrates a self-variation.

FIG. 19 illustrates a semiconductor device which is manufactured first, specifically, a relatively-positional relation between the lower pattern 100 and the upper pattern 200 at the initial state. As some semiconductor devices are manufactured thereafter, the stepper correction value varies. FIG. 20 illustrates an intermediate stage of a process for manufacturing the somethingth semiconductor device, where the alignment of the pattern 200 is about to start. FIG. 19 shows a fringe R10 of the pattern 100 at the initial state and a fringe R20 of the pattern 200 at the initial state. The fringes R10 and R20 of FIG. 20 correspond to those of FIG. 19.

The self-variation of magnification is the travel from the position of the fringe R10 of the reference frame to the position of the fringe R1 of the pattern 100. The self-variation of the lower pattern is referred to as the lower-pattern variation.

The fourth preferred embodiment produces the same effects as the third preferred embodiment, replacing the self-variation of shot rotation and the lower-pattern variation of shot rotation by the self-variation of magnification and the lower-pattern variation of magnification, respectively.

The Fifth Preferred Embodiment

The fifth preferred embodiment relates to calculation of offsets X and Y among the stepper correction values for wafer component carried out in the Step S1031 in the first and third preferred embodiments.

Figure 21:
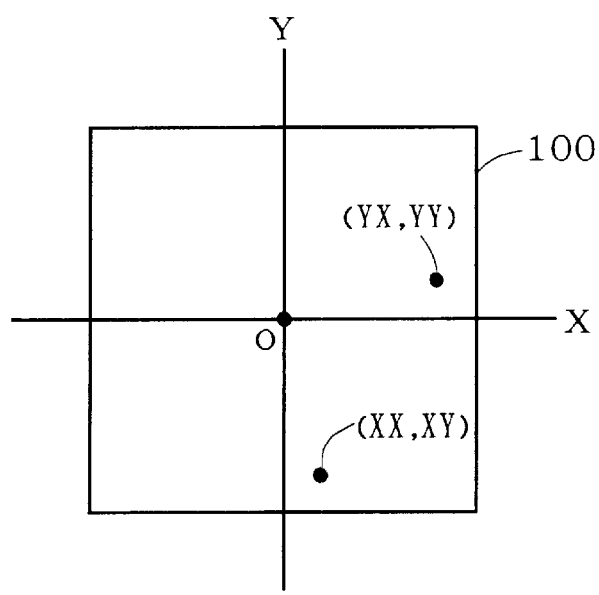
FIG. 21 shows a state before the lower pattern rotates.
Figure 22:
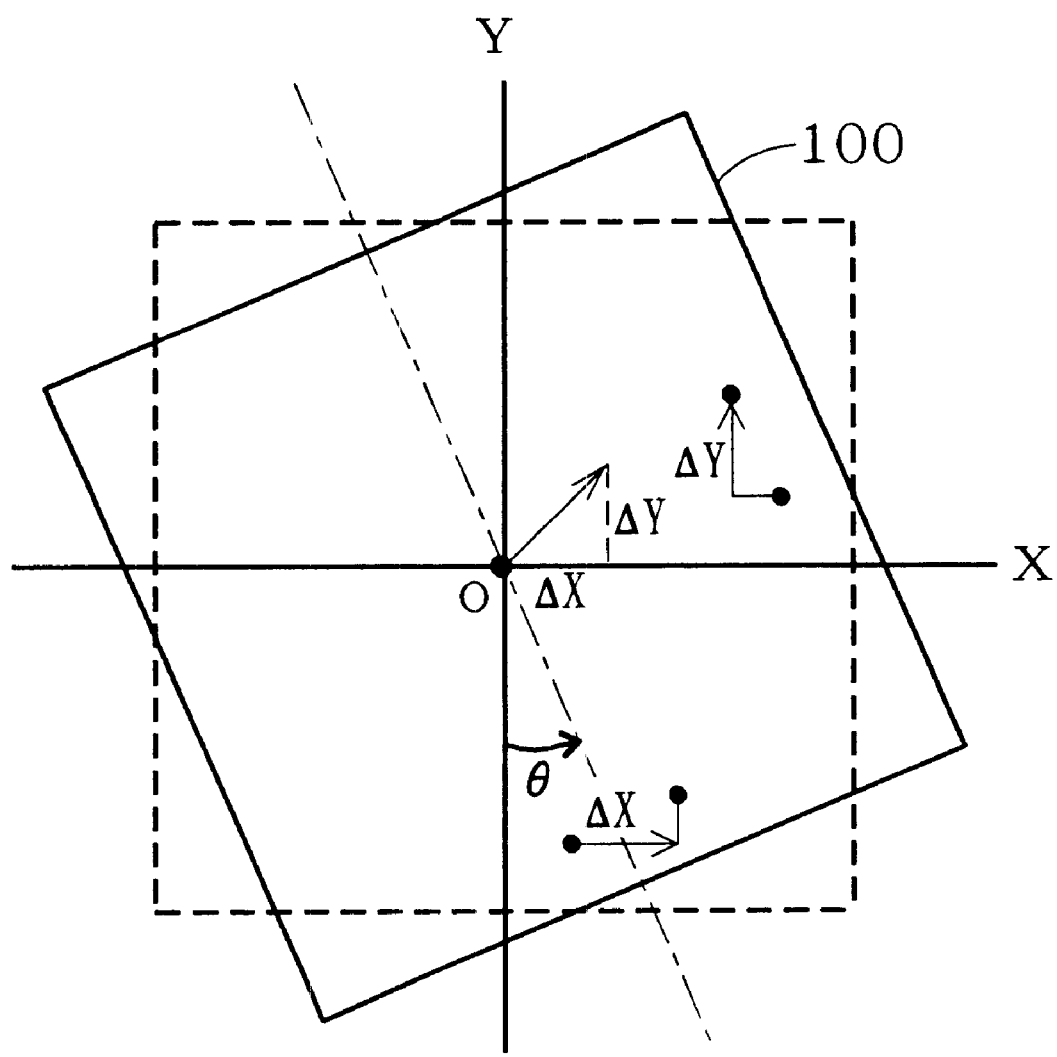
FIG. 22 shows a state after the lower pattern rotates.

FIG. 21 shows the state before rotation of the pattern 100 while FIG. 22 shows the states after rotation of the pattern 100 by $\theta$ which is the self-rotation or the self-variation of the pattern 100. In FIG. 21, the coordinate of an alignment mark for X-coordinate is (XX, XY) and the coordinate of an alignment mark for Y-coordinate is (YX, YY). When the lower pattern of FIG. 21 rotates by $\theta$, the alignment mark for X-coordinate moves by $\Delta X$ in a direction of the X-coordinate and the alignment mark for Y-coordinate moves by $\Delta Y$ in a direction of the Y-coordinate. In other words, to rotate by $\theta$ is to move a center point O by $\Delta X$ and $\Delta Y$ on the whole. Therefore, rotation by $\theta$ increases the possibility of making offset out of specification in the later major steps. In particular, though $\Delta X$ and $\Delta Y$ are negligible when the alignment mark exists at the center portion of the reticle, $\Delta X$ and $\Delta Y$ are appreciably large when the alignment mark exists at the peripheral portion of the reticle.

In order to prevent offset out of specification, when the lower pattern is rotated by $\theta$ in a major step, offsets X and Y including the variations $\Delta X(\theta)$ and $\Delta Y(\theta)$, respectively, are set in an alignment of a later major step. Specifically, the offsets X and Y to be set in the alignment of the later major step are as $$\text{offset } X = f(\text{true shear}) + \Delta X(\theta) \tag{10}$$

$$\text{offset } Y = f(\text{true shear}) + \Delta Y(\theta) \tag{11}$$

The variations $\Delta X(\theta)$ and $\Delta Y(\theta)$ are expressed respectively as $$\Delta X(\theta) = XX \cdot \cos\theta - XY \cdot \sin\theta - XX \tag{12}$$

$$\Delta Y(\theta) = YX \cdot \sin\theta - YY \cdot \cos\theta - YY \tag{13}$$

Thus, in Step S1031, $\theta$ is transformed into the variations $\Delta X$ and $\Delta Y$ of the stepper correction values for the offsets X and Y by using Equations (12) and (13), and then the stepper correction values for the offsets X and Y including the variations $\Delta X$ and $\Delta Y$ are obtained from Equations (10) and (11).

The fifth preferred embodiment produces an effect of preventing any offset out of specification.

The Sixth Preferred Embodiment

In the first, third, and fifth preferred embodiments, for example, when the stepper correction value for shot component set to the stepper in the present alignment is +2 and the OCCV is −5, the stepper correction value to be set to the stepper for the next alignment is +7=(+2−(−5)). Setting a large stepper correction value like +7 for the next alignment increases the possibility of making the offset out of specification since the shot rotation has an effect on the offset. Then, the sixth preferred embodiment is intended to prevent any large stepper correction value from being set for the next alignment.

Figure 23:
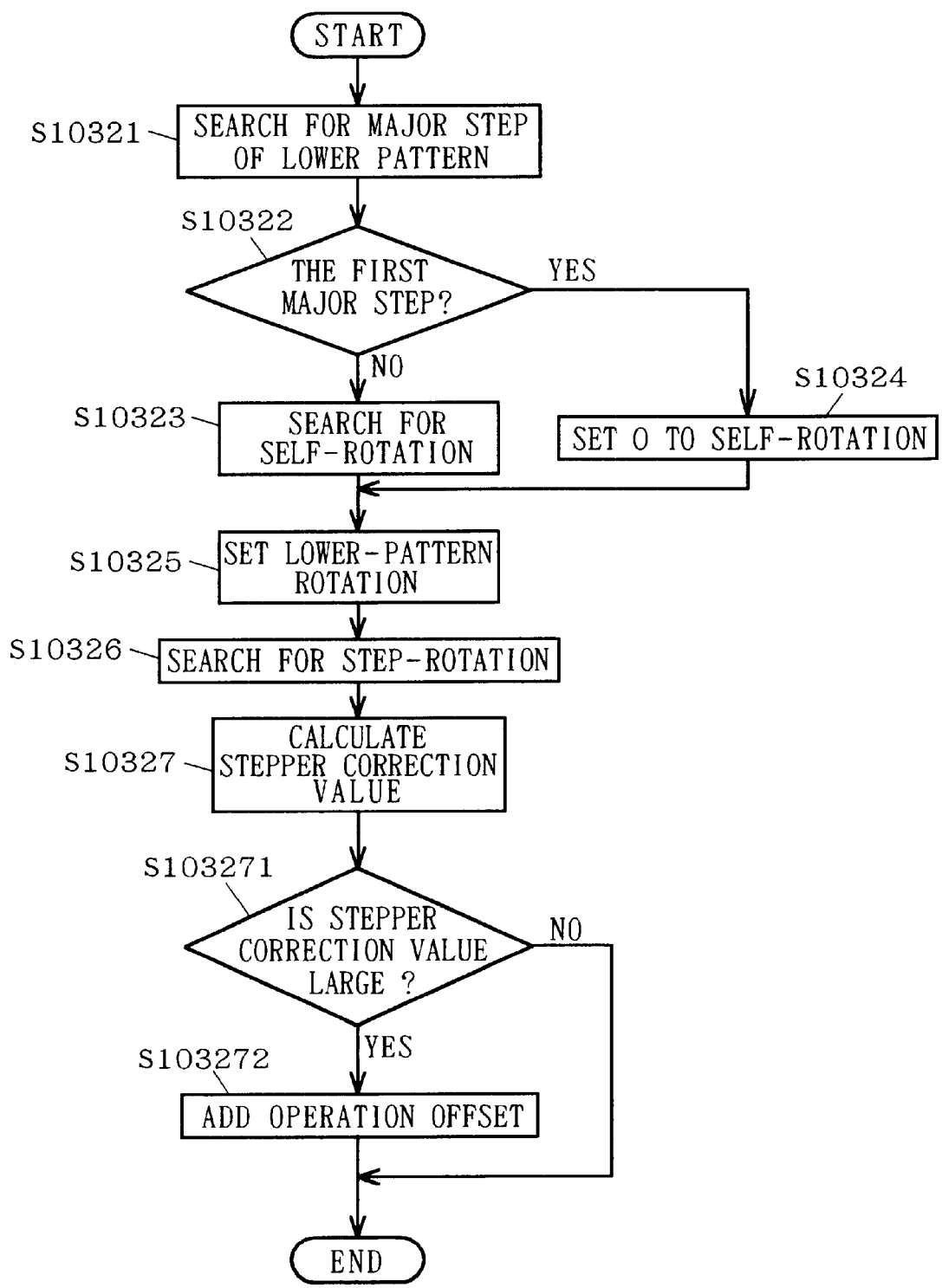
FIG. 23 is a flowchart showing a method for correcting alignment in accordance with a sixth preferred embodiment of the present invention.
Figure 24:
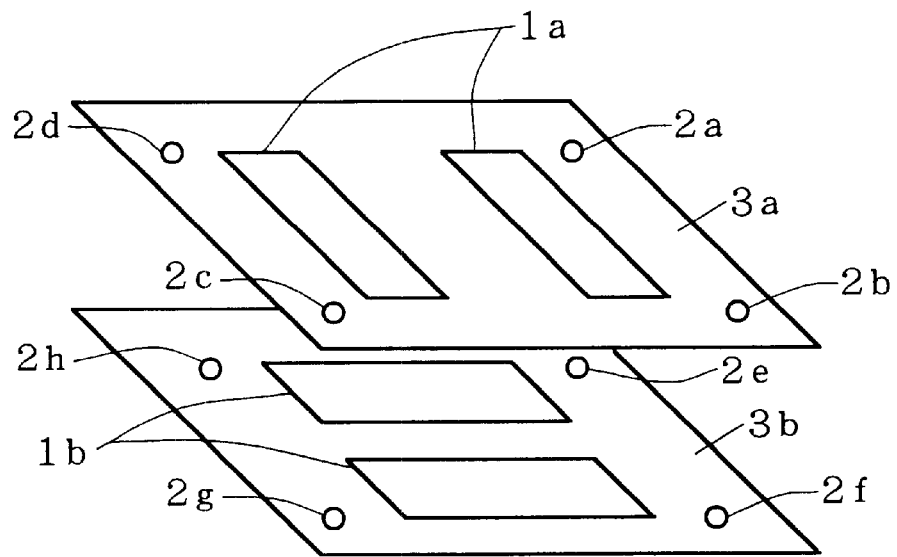
FIG. 24 illustrates an alignment.
Figure 25:
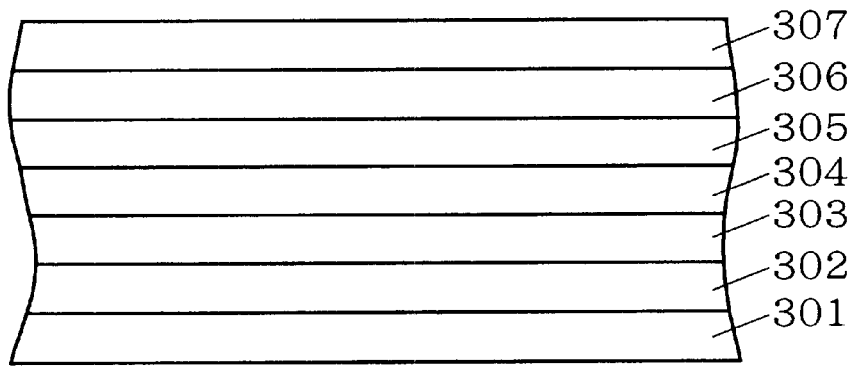
FIG. 25 is a conceptional section of a semiconductor device.

The production control system body 6 in the sixth preferred embodiment performs the same main operation as that in the first, third and fifth preferred embodiments, and in addition to Steps of FIG. 8, performs Steps S103271 to S103272 of FIG. 23.

Herein, it is assumed that the above stepper correction value of +7 is obtained by calculation in Step S10327. When it is judged that the stepper correction value of +7 is not less than a predetermined threshold value (Step S103271), a value of −3 for reducing the stepper correction value (hereinafter, referred to as "operation offset") is added to the stepper correction value of +7, to obtain a stepper correction value of +4. Therefore, the stepper correction value is reduced by almost half as compared with +7, and the OCCV may become −2 with good possibility.

In the next step S103271, an operation offset is set at −2 to obtain a stepper correction value of +5. Thus, as the operation offset is increased by +1, the OCCV is gradually made closer to zero.

The sixth preferred embodiment produces the following effects. First, when the stepper correction value is large, the stepper correction value is gradually changed and the OCCV is made closer to zero with the operation offset, to prevent any offset out of specification.

Further, when the background-art method for correcting alignment is changed into the method for correcting alignment of the first preferred embodiment of the present invention, there are many cases where large stepper correction values are obtained by calculation, causing out-of-specification. Applying the sixth preferred embodiment reduces the stepper correction value and prevents out-of-specification.

The above discussion is made on a case where the sixth preferred embodiment is applied to the first, third and fifth preferred embodiments. Applying the sixth preferred embodiment to the second and fourth preferred embodiments also produces the following effect. As to magnification, it is not always a best resolution that the OCCV is changed directly to zero. When a stepper correction value as large as changes the OCCV directly to zero is set to the stepper, the lens system PL of FIG. 27 has in some cases less precision because of residual magnification. Then, the stepper correction value for magnification is gradually changed with the operation offset, to prevent degradation in precision of the lens system PL and out-of-specification.

Modification

Though the alignment correction unit 6a is described as one function of the production control system body 6 in FIG. 26, it may be provided outside the production control system body 6. For example, the alignment correction unit 6a may be provided as an independent device communicable with the production control system body 6.

While the invention has been shown and described in detail, the foregoing description is in all aspects illustrative and not restrictive. It is therefore understood that numerous modifications and variations can be devised without departing from the scope of the invention.

I claim:

1. A correction device for correcting alignment, said correction device being used in a manufacturing system for manufacturing a semiconductor device onto each of plural wafers successively supplied, said manufacturing system including:
   steppers to which stepper correction values are set to eliminate shift amounts between a plurality of patterns being stacked-on said semiconductor device; and
   an overlay checking device for detecting said shift amounts between said plurality of patterns and forming overlay checking correction values for eliminating said detected shift amounts, and said correction device being configured to generate said stepper correction values being set by said manufacturing system,
   wherein said manufacturing system manages lower patterns respectively corresponding to said plurality of patterns,
   said correction device comprising:
   (a) an element configured to manage travels from a reference position to positions of said plurality of patterns by said manufacturing system; and
   (b) an element configured to generate a value including one of said travels of a lower pattern corresponding to a pattern to be aligned in a next alignment as one of said stepper correction values to determine a position of said pattern to be aligned by said manufacturing system, wherein
   said element (a) further comprises:
   (a-1) an element configured to calculate and store a step-travel for each of said plurality of patterns by said manufacturing system, said step-travel being defined as corresponding one of said overlay checking correction values subtracted by corresponding one of said stepper correction values and added with one of said travels of corresponding lower pattern, and
   said element (b) further comprises:
   (b-1) an element configured to generate a value as said one of said stepper correction values by subtracting, from said one-of said travels of said lower pattern corresponding to said pattern-to be aligned-in said next alignment, one of said step-travels or a trend thereof calculated for a corresponding pattern having already been aligned onto another at least one wafer than a wafer to be subjected to said next alignment by using the same stepper as that to be used in said next alignment.

2. The correction device of claim 1, wherein said stepper correction values include a stepper correction value for offset and a stepper correction value for shot rotation,
   said one of said stepper correction values generated by element (b) is said stepper correction value for shot rotation, and
   said correction device further comprises:
   (c) an element configured to generate said stepper correction value for offset,
   wherein said travel is transformed into the variation of said stepper correction value for offset and said variation is added to said stepper correction value for offset generated by element (c).

3. A semiconductor device made using the correction device for correcting alignment according to claim 1.

4. A correction device for correcting a fabricating process, said correction device being used in a manufacturing system for manufacturing a semiconductor device onto each of plural wafers successively supplied, said manufacturing system including:
   fabrication devices to which fabrication correction values are set to eliminate shift amounts between a plurality of processings successively performed on said semiconductor device; and a checking device for detecting said shift amounts between said plurality of processings and forming checking correction values for eliminating said detected shift amounts, and said correction device being configured to generate said fabrication correction values being set by said manufacturing system,
   wherein said manufacturing system manages previous processings respectively corresponding to said plurality of processings,
   said correction device comprising:
   (a) an element configured to manage travels from a reference condition to conditions of said plurality of processings by said manufacturing system; and
   (b) an element configured to generate a value including one of said travels of a previous processing corresponding to a processing to be performed in a next fabrication process as one of said fabrication correction values to determine a condition of said processing to be performed by said manufacturing system, wherein said element (a) further comprises:
- (a-1) an element configured to calculate and store a step-travel for each of said plurality of processings by said manufacturing system, said step-travel being defined as corresponding one of said checking correction values subtracted by corresponding one of said fabrication correction values and added with one of said travels of corresponding previous processing, and said element (b) further comprises:
- (b-1) an element configured to generate a value as said one of said fabrication correction values by subtracting, from said one of said travels of said previous processing corresponding to said processing to be performed in said next fabrication process, one of said step-travels or a trend thereof calculated for a corresponding processing having already been performed onto another at least one wafer than a wafer to be subjected to said next processing by using the same fabrication device as that to be used in said next processing.

5. The correction device of claim 4, further comprising:
- (c) an element configured to compare said fabrication correction value with a predetermined threshold value; and
- (d) an element configured to add a value for reducing said fabrication correction value to each of said fabrication correction values when said each of said fabrication correction values is not less than said threshold value as a result of the comparing of element (c).

6. A semiconductor device made using the correction device for correcting a fabrication process according to claim 4.

* * * * *